United States Patent
Abu-Rahma et al.

(10) Patent No.: US 8,130,534 B2
(45) Date of Patent: Mar. 6, 2012

(54) SYSTEM AND METHOD TO READ AND WRITE DATA A MAGNETIC TUNNEL JUNCTION ELEMENT

(75) Inventors: Mohamed Hassan Abu-Rahma, San Diego, CA (US); Seung-Chul Song, Austin, TX (US); Sei Seung Yoon, San Diego, CA (US); Dongkyu Park, San Diego, CA (US); Cheng Zhong, San Diego, CA (US); Anosh B. Davierwalla, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 273 days.

(21) Appl. No.: 12/350,304

(22) Filed: Jan. 8, 2009

(65) Prior Publication Data

US 2010/0172173 A1 Jul. 8, 2010

(51) Int. Cl.
*G11C 11/00* (2006.01)
(52) U.S. Cl. ......................... 365/158; 365/148
(58) Field of Classification Search .................. 365/154, 365/158, 148
See application file for complete search history.

(56) References Cited

U.S. PATENT DOCUMENTS

| | | | |
|---|---|---|---|
| 7,505,307 | B2 | 3/2009 | Ueda |
| 2005/0146925 | A1 | 7/2005 | Hidaka |
| 2006/0067112 | A1 | 3/2006 | Ferrant et al. |
| 2007/0279963 | A1 | 12/2007 | Tsuchida et al. |
| 2007/0279967 | A1 | 12/2007 | Luo et al. |
| 2008/0203469 | A1 | 8/2008 | Gruening-von Schwerin |
| 2008/0310213 | A1* | 12/2008 | Chen et al. ............ 365/158 |
| 2009/0129143 | A1* | 5/2009 | Guo et al. ............ 365/158 |

OTHER PUBLICATIONS

Endo, et al: "Enhancing Sram Cell Performance By Using Independent Double-Gate Finfet," IEDM Technical Digest 2008, IEEE, Piscataway, NJ, US, Dec. 15, 2008, pp. 1-4, ISBN: 978-1-4244-2377-4.
International Search Report/Written Opinion—PCT/US10/020524—International Search Authority EPO— May 4, 2010.
Klostermann, U.K et al., "A Perpendicular Spin Torque Switching based MRAM for the 28 nm Technology Node," in Int. Electron Devices Meeting (IEDM) Tech. Dig.. 2007, pp. 187-190.

* cited by examiner

*Primary Examiner* — Hoai V Ho
*Assistant Examiner* — Anthan T Tran
(74) *Attorney, Agent, or Firm* — Sam Talpalatsky; Nicholas J. Pauley; Jonathan T. Velasco

(57) ABSTRACT

A system and method to read and write data in magnetic random access memories are disclosed. In a particular embodiment, a device includes a spin transfer torque magnetic tunnel junction (STT-MTJ) element and a transistor with a first gate and a second gate coupled to the STT-MTJ element.

25 Claims, 6 Drawing Sheets

SYSTEM AND METHOD TO READ AND WRITE DATA A MAGNETIC TUNNEL JUNCTION ELEMENT

I. FIELD

The present disclosure is generally related to systems and methods to read and write data with respect to a magnetic tunnel junction (MTJ) of magnetic random access memories.

II. DESCRIPTION OF RELATED ART

In conventional Spin Transfer Torque Magnetoresistive Random Access Memories (STT-MRAMs) the same current path is often used to write data and to read data. To write data in a conventional STT-MRAM, a write current may flow through a magnetic tunnel junction (MTJ) element and an associated access transistor. The write current can change the orientation of magnetic poles in the MTJ element. When the write current flows in a first direction, the MTJ element can be placed into or remain in a first state, where its magnetic poles are in a parallel orientation. When the write current flows in a second direction, opposite to the first direction, the MTJ element can be placed into or remain in a second state, where its magnetic poles are in an anti-parallel orientation. To read data in a conventional STT-MRAM, a read current may flow through the MTJ element and its associated access transistor via the same current path used to write data in the MTJ element. If the magnetic poles of the MTJ element are in a parallel orientation, the MTJ element presents a resistance that is different than the resistance the MTJ element would present if the magnetic poles of the MTJ element were in an anti-parallel orientation. Thus, in a conventional STT-MRAM, there are two distinct states defined by two different resistances, and a logic "0" or a logic "1" value can be read based on the state.

In a conventional STT-MRAM as described above, a high read current can allow more consistent detection of MTJ element resistance, which may translate into better read accuracy. Further, a high read current can reduce the time required for sensing resistance, which may translate into a faster read cycle. However, if the read current has a value exceeding the value of a critical disturb current of the MTJ element, the read current can cause the MTJ element to change states (or "flip"). Keeping the value of the read current below the value of the critical disturb current can be performed by protection and tracking circuits but such circuits can increase the size and reduce performance of STT-MRAM devices.

III. SUMMARY

In a particular embodiment, a device is disclosed that includes a spin transfer torque (STT) magnetic tunnel junction (MTJ) element and a transistor including a first gate and a second gate that is coupled to the STT-MTJ element.

In another particular embodiment, a memory is disclosed. The memory includes an array of memory cells. The array of memory cells has a number of columns. Each of the memory cells includes a MTJ element coupled to a dual-gate transistor that has a first gate coupled to a word line and a second gate coupled to a write enable line. At least one column is controllable by the write enable line during a write operation.

In another particular embodiment, a method for storing data in a STT-MRAM is disclosed. The method includes writing data into and reading data out of a MTJ element of the STT-MRAM device. The MTJ element is coupled to a transistor that includes a first gate and a second gate.

A particular advantage provided by at least one of the disclosed embodiments is that data read margins may be improved at a STT-MRAM that uses separate read/write paths due to use of a high read current.

Another particular advantage provided by at least one of the disclosed embodiments in that the size of a STT-MRAM device can be reduced as a result of removing certain protection and tracking circuits.

Other aspects, advantages, and features of the present disclosure will become apparent after review of the entire application, including the following sections: Brief Description of the Drawings, Detailed Description, and the Claims.

IV. DETAILED DESCRIPTION

Figure 1:
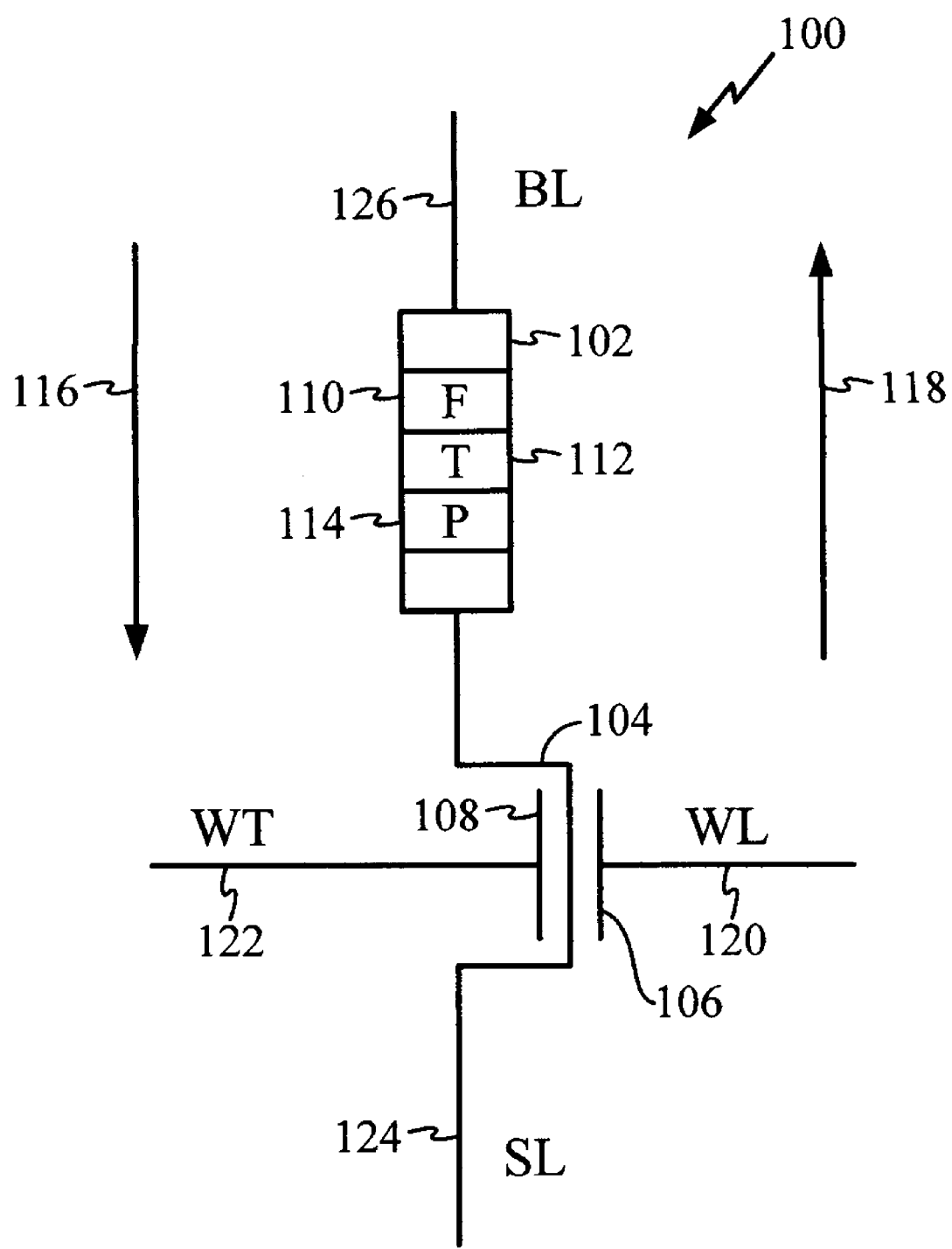
FIG. 1 is a schematic diagram of a particular illustrative embodiment of a device with separate data read and write paths.

Referring to FIG. 1, a particular illustrative embodiment of a device is depicted and generally designated 100. The device 100 includes a magnetic tunnel junction (MTJ) element 102, such as a spin transfer torque magnetic tunnel junction (STT-MTJ) cell, coupled to a transistor 104 having a first gate 106 and a second gate 108. The device 100 has a common portion of a read/write data path that includes the transistor 104 coupled to the MTJ element 102. The transistor 104 selectively provides separate data read and write paths to access the MTJ element 102. A data read path can be defined by biasing the first gate 106 at a logical high level while biasing the second gate 108 at a logical low level. In such a case, only the first (or "front") gate 106 of the transistor 104 is in conduction (channel inversion mode) while the second (or "back") gate 108 of the transistor 104 is depleted (i.e., allowing only negligible current flow). The read current is limited to the maximum current through the first gate 106 while the second gate 108 is disabled. A data write path can be defined by biasing both the first and second gates 106 and 108 at a logical high level so that both gates are in conduction (i.e., channel inversion mode). In such a case, the transistor 104 may fully conduct, and the write current can be higher than the value of the read current in the same device 100. Since this structure enables a certain read current and a different write current, the transistor 104 provides separate data read and write paths. The read path includes an inversion channel of the first gate 106, while the write path includes the inversion channels of both the first gate 106 and the second gate 108.

The MTJ element 102 can be used for data storage. The MTJ element 102 includes a free magnetic layer (designated F, reference numeral 110, in FIG. 1), a thin dielectric tunnel barrier (designated T, reference numeral 112, in FIG. 1), and a pinned magnetic layer (designated P, reference numeral 114, in FIG. 1). When a bias is applied to the MTJ element 102, electrons that are spin polarized by the magnetic layers traverse the dielectric tunnel barrier T 112 through a process known as tunneling. Data may be written to the MTJ element 102 by passing a write current through the MTJ element 102 in a first direction, writing data in a first state, and by passing a write current though the MTJ element 102 in a second direction, writing data in a second state. The first direction of the write current through the MTJ element 102 is indicated by arrow 116. The second direction of the write current through the MTJ element 102 is indicated by arrow 118. The data value stored at the MTJ element 102 is determined by the direction of the write current through the tunnel barrier T 112. The MTJ element 102 has a low resistance when the magnetic moment of the free magnetic layer F 110 is parallel to the magnetic moment of the pinned magnetic layer P 114 and a high resistance when the magnetic moment of the free magnetic layer F 110 is oriented anti-parallel to the magnetic moment of the pinned magnetic layer P 114. Thus, a read current passing through the MTJ element 102 can detect one of two different resistances, depending on whether magnetic moments are oriented parallel or anti-parallel, and two different values—e.g., a logic "0" and a logic "1"—can be read. The MTJ element 102 also has a critical disturbance current value above which current passing through the MTJ element 102 can cause the MTJ element 102 to change states (or "flip") to write data, and below which data may be safely read without disrupting the stored value.

The first gate 106 and the second gate 108 of the transistor 104 can be independently biasable. That is, the bias voltage of the first gate 106 and the bias voltage of the second gate 108 of the transistor 104 can be established independently. The transistor 104 can be an access transistor for the MTJ element 102, with the first gate 106 of the transistor 104 coupled to a word line 120. The second gate 108 (which can be called a "back gate") of the transistor 104 can be coupled to a write enable line 122. The transistor 104 also has a source terminal coupled to a source line 124 and a drain terminal coupled to a bit line 126 though the MTJ element 102. The word line 120 can be the same word line as used for other access transistors of multiple memory cells in a same row of a memory array. The write enable line 122 can be the same write enable line as used for other access transistors of multiple memory cells in a same column of a memory array. The source line 124 can be the same source line as used for other access transistors of multiple memory cells in a same column of a memory array. The bit line 126 can be a same bit line as that used to couple to other MTJ elements in a same column of a memory array. In a particular embodiment, the transistor 104 is an independent gate "fin" Field-Effect Transistor (IG-FinFET).

The first gate 106 of the transistor 104 and the second gate 108 of the transistor 104 can decouple a data write path and a data read path for the device 100. The first gate 106 biased to a logical high level (or "on," enabling current flow) and the second gate 108 biased to a logical low level (or "off," disabling current flow) can define a read path. The first gate 106 and the second gate 108 both biased to a logical high level can define a write path that is distinct from the read path. The first gate 106 can limit the maximum current to not exceed a critical disturbance current value of the MTJ element 102. This can ensure that the MTJ element 102 does not change states during a read operation. Further, the level of a signal (e.g., high or low) at the second gate 108 can distinguish separate data read and data write paths. For example, the second gate 108 can be biased to disable a write current during a data read operation or to enable a write current during a data write operation. Thus, in a particular embodiment, a data write can be selectively enabled or disabled by applying a signal to the second gate 108.

A threshold voltage of a gate of a transistor is usually defined as the value of voltage applied to the gate above which current flows from the drain to the source and below which current does not flow from the drain to the source. However, when a voltage below the threshold voltage is applied to the gate of a transistor, at least some, usually a small amount, of current flows from the drain to the source. This current is often called "leakage." In a symmetric dual-gate FinFET, both of the transistor's gates have about the same threshold voltage values, while in an asymmetric dual-gate FinFET, each of the transistor's gates have different threshold voltage values. In a particular embodiment, with a symmetric dual-gate transistor 104, the value of the write current may be about twice the value of the read current. In a particular embodiment, a negative voltage can be applied to either gate to reduce leakage. In a particular embodiment, an asymmetric transistor 104 can reduce leakage. For example, the threshold voltage of the first gate 106 of the transistor 104 may be designed such that a negative voltage does not need to be applied to the first gate 106 to reduce "leakage" current flow between the drain and source of the transistor 104. Generally, the higher the threshold voltage, the lower the leakage current.

Data may be written to the MTJ element 102 by enabling both the first and second gates 106 and 108 of the transistor 104, applying a voltage across the source and bit lines 124 and 126 to induce a current greater than the critical disturb current to flow through the MTJ element 102. This can place the MTJ element in either a first or a second state which can be a logic "1" or a logic "0." Data may be read by enabling the first gate 106 and disabling the second gate 108, applying a voltage across the source and bit lines 124 and 126, to induce a current that is lower than the critical disturb current to flow through the MTJ element 102. The read current can be used for detection of one of two different resistances, which can be read as a logic "1" or a logic "0." By using the first and second gates 106 and 108 to limit current to a value less than the critical disturb current for data reads and to enable generation of a current that has a value greater than the critical disturb current for data writes, additional protection and tracking circuitry to avoid excess current may be reduced or eliminated. In addition, controlling read and write data paths using a single transistor can enable a footprint of the device 100 to be reduced in comparison to conventional MRAM bitcells.

The device 100 is unique and has a number of benefits. The device 100 can decouple the data read and write paths for STT-MRAM devices, allowing high data write currents and low data read currents, both of which improve the performance of the STT-MRAM. The device 100 can provide a STT-MRAM memory array with a protection mechanism to prevent an inadvertent cell flip of a memory cell during a read operation. The device 100 can lower the area of sensing circuitry and reduce cost by enabling omission of a dedicated current protection circuit. The device 100 can improve performance by enabling higher reading and writing currents to provide higher operational speed. The device 100 can improve read detection robustness by enabling a higher read current sensing margin.

Figure 2:
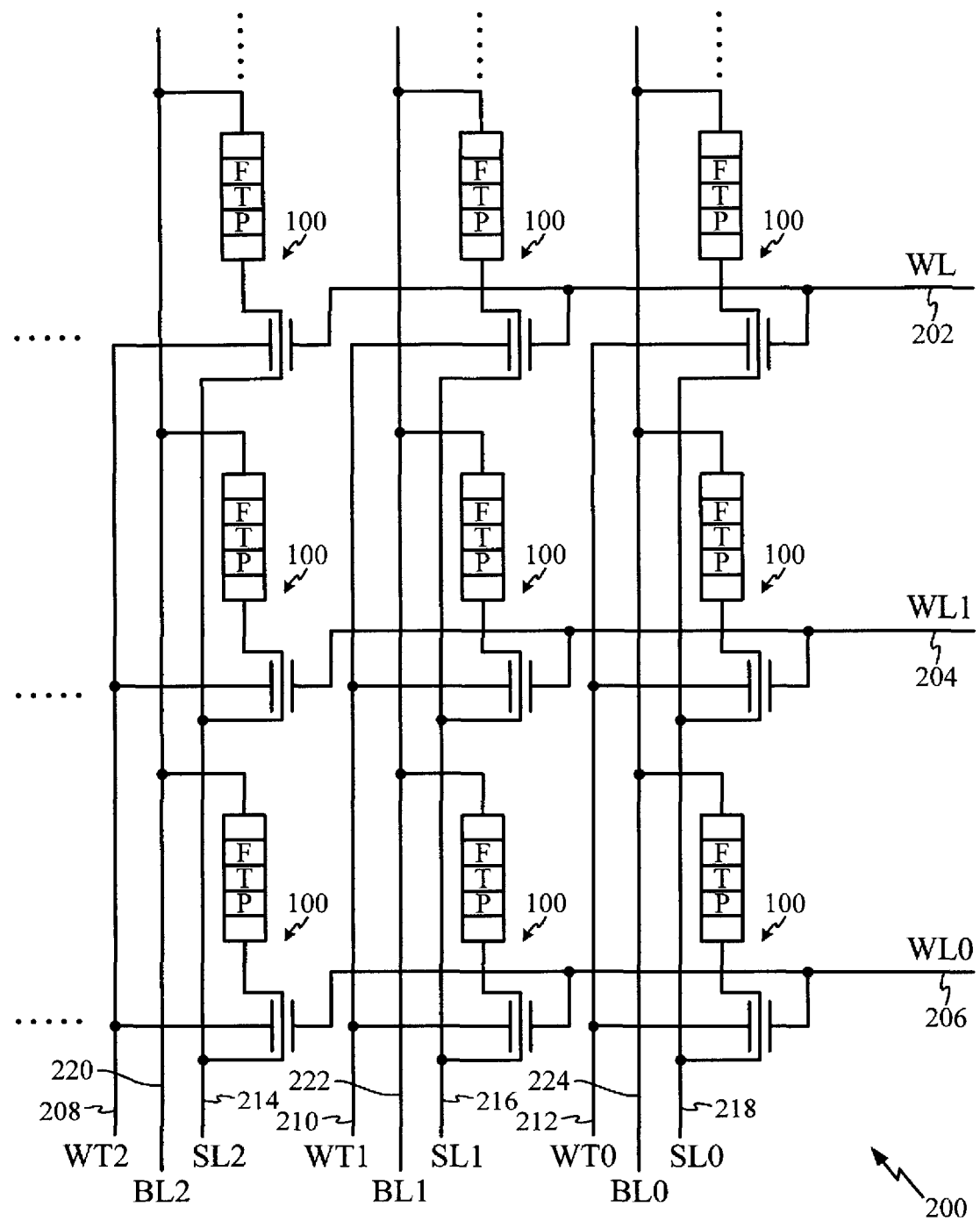
FIG. 2 is a schematic diagram of a particular illustrative embodiment of a memory array of devices with separate data read and write paths.

Referring to FIG. 2, a diagram of a particular illustrative embodiment of a memory array including multiple cells, where each cell includes a device 100 as illustrated in FIG. 1, is depicted and generally designated 200. The memory array 200 is made up of a plurality of the devices 100 arranged in three rows and three columns. The first gates of the transistors of the devices 100 in the same row are coupled to the same word line. For example, the first gates of the transistors of the three devices 100 in the top row are coupled to word line 202. The first gates of the transistors of the three devices 100 in the middle row are coupled to word line 204. The first gates of the transistors of the devices 100 in the bottom row are coupled to word line 206.

The memory array 200 is illustrative only. Whereas three rows and three columns form the illustrated array 200 in FIG. 2, an array may have any number of rows and columns.

Thus, the memory array 200 comprises a multitude of memory cells. The memory array 200 includes a plurality of columns. Each memory cell in the memory array 200 includes a magnetic tunnel junction (MTJ) device coupled to a dual-gate transistor. The dual-gate transistor has a first gate coupled to a word line of a plurality of word lines and has a second gate coupled to a write enable line of a plurality of write enable lines. At least one column of the plurality of columns is controllable by the write enable line during a write operation.

The second gates of the transistors of the devices 100 in the same column are coupled to the same write enable line. For example, the second gates of the transistors of the three devices 100 in the leftmost column are coupled to write enable line 208. The second gates of the transistors of the three devices 100 in the center column are coupled to write enable line 210. The second gates of the transistors of the three devices 100 in the rightmost column are coupled to write enable line 212.

The source terminals of the transistors of the devices 100 in the same column are coupled to the same source line. For example, the source terminals of the transistors of the three devices 100 in the leftmost column are coupled to source line 214. The second gates of the transistors of the three devices 100 in the center column are coupled to source line 216. The second gates of the transistors of the three devices 100 in the rightmost column are coupled to source line 218.

The drain terminals of the transistors of the devices 100 in the same column are coupled to the same bit line though an associated MTJ element. For example, the drain terminals of the transistors of the three devices 100 in the leftmost column are coupled to bit line 220. The drain terminals of the transistors of the three devices 100 in the center column are coupled to bit line 222. The drain terminals of the transistors of the three devices 100 in the rightmost column are coupled to bit line 224.

Figure 3:
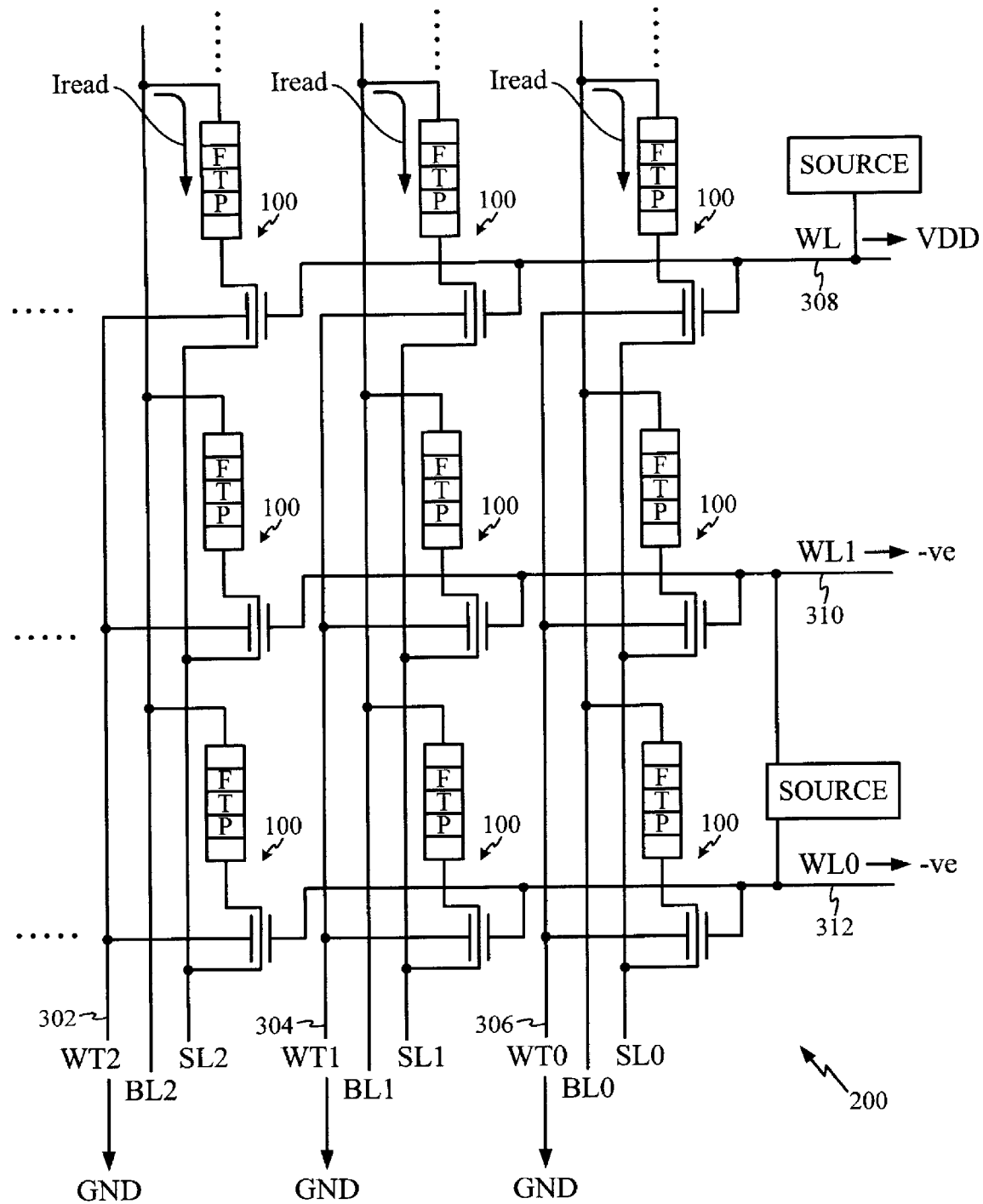
FIG. 3 is a schematic diagram of a particular illustrative embodiment to illustrate a read operation of a memory array of devices with separate data read and write paths.

Referring to FIG. 3, a schematic diagram of a particular illustrative embodiment of a memory array of devices with separate data read and write paths is depicted. In this particular embodiment, a write disable bias voltage, such as a zero bias voltage (GND), is applied to each of the write enable lines 302, 304, 306. This disables the second gates of each device 100 and gives each device 100 a nominal threshold voltage. During a read operation, a supply voltage (VDD) is applied to a selected word line 308 to enable the first gates of all of the devices 100 in the selected top row. A negative bias voltage (–ve) is applied to the other word lines 310, 312 in the memory array, turning off the first gates of the devices 100 in the non-selected rows, effectively disabling them. The result is that a low driving current can be used for the read current Iread (shown flowing through the three devices 100 in the top row), because only one set of gates in each column (the first gates of devices in the top row connected to word line 308) is active.

Figure 4:
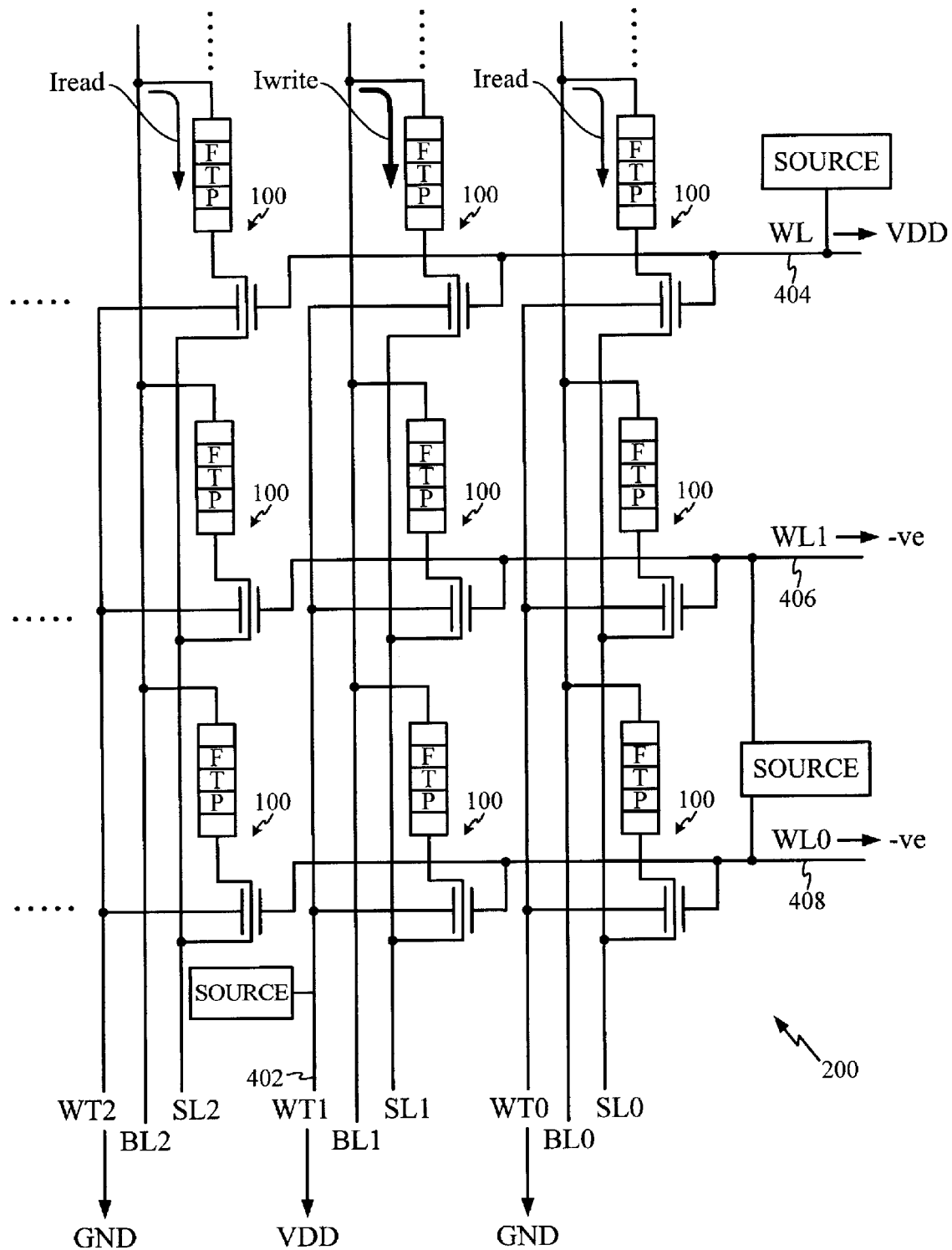
FIG. 4 is a schematic diagram of a particular illustrative embodiment to illustrate a write operation of a memory array of devices with separate data read and write paths.

Referring to FIG. 4, a schematic diagram of a particular illustrative embodiment of a memory array of devices 100 with separate data read and write paths is depicted. A column (the middle column in FIG. 4) is selected for writing by applying a supply voltage (VDD) to the write enable line 402. This activates the second gates for the devices 100 in the selected column and lowers the threshold voltage for the first gates of those devices 100 in the selected column. A row (the top row) is selected and a supply voltage (VDD) is applied to the word line 404 of that selected row and a negative bias voltage (–ve) is applied to the word lines 406, 408 of the unselected rows. Application of a negative bias voltage to the unselected wordlines 406, 408 effectively turns each of the devices 100 in the unselected rows off. Thus, only the selected memory cell (the device 100 in the upper row, middle column in FIG. 4) has a high write current Iwrite. A write current flowing through the selected memory cell causes a data value to be stored in the selected memory cell. When the write current flows in one direction, a first of two values is stored in the memory cell. When the write current flows in the other direction, a second of two values is stored in the memory cell. Each of the half-selected memory cells (each of the devices 100 in the upper row, leftmost and rightmost columns) has a low read current.

Figure 5:
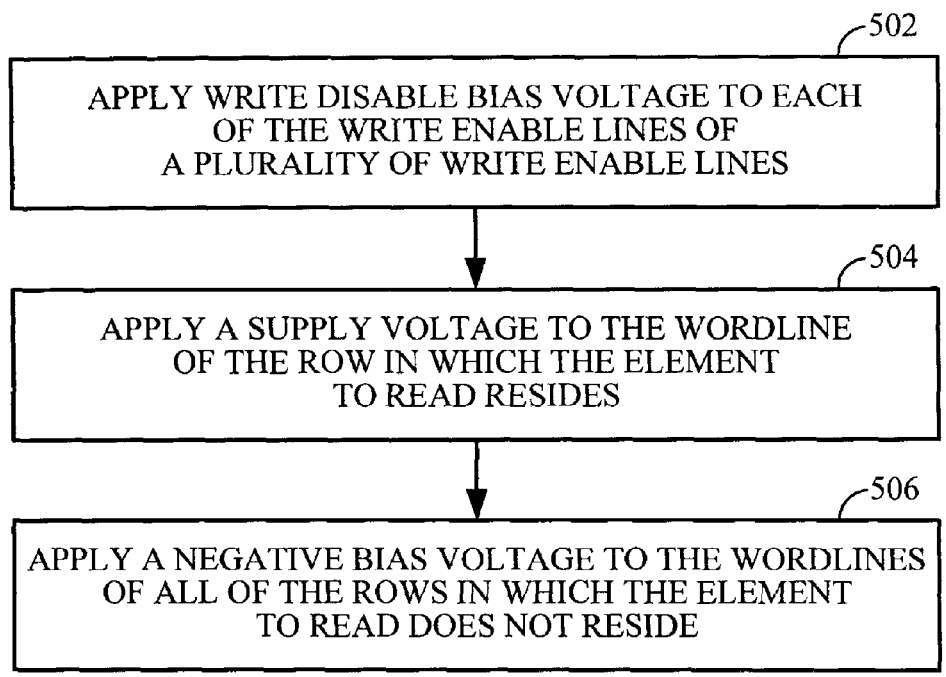
FIG. 5 is a flow chart of a particular illustrative embodiment of a method of reading data in a memory array of devices with separate data read and write paths.

Referring to FIG. 5, a flow chart of a particular illustrative embodiment of a method of reading data in a memory array of devices with separate data read and write paths is depicted. The device 100 that it is desired to be read resides in a "selected" row; the remaining rows are "unselected" rows. At 502, a write disable bias voltage, such as a zero voltage or a negative voltage, is applied to each of the write enable lines of the memory array that includes devices 100 having a STT-MTJ element and a transistor coupled to the STT-MTJ element. For example, the write enable lines may be the lines 208, 210 and 212 of FIG. 2, or the lines 302, 304 or 306 of FIG. 3. The write disable bias voltage disables the second gates for the each of the transistors 104 of the devices 100 in the memory array.

At 504, a supply voltage is applied to a word line of a selected row. For example, in FIG. 3, a device that it is desired to be read resides in the top row, making the top row the selected row, and VDD is applied to the word line 308 of the top row. Applying the supply voltage to the selected row enables the first gates 106 of the transistors 104 of the devices 100 in the selected row.

At 506, a negative bias voltage is applied to the word lines of the unselected rows. For example, in FIG. 3, the device that it is desired to be read does not reside in the middle or bottom rows, making the middle and bottom rows unselected rows, and a negative voltage –ve is applied to the word lines 310 and 312 of the middle and bottom rows. This disables the first gates 106 of each of the transistors 104 of the devices 100 in the unselected rows, effectively turning off the transistors 104 of the devices 100 in the unselected rows.

Thus, a particular illustrative embodiment employing the disclosed method can, during a read cycle, have access transistors with their second gates off and with first gates enabled only if they are in a selected row. Thus, in a particular illustrative embodiment, the first gate is biased at a logical high level and the second gate is biased at a logical low level to read data.

Figure 6:
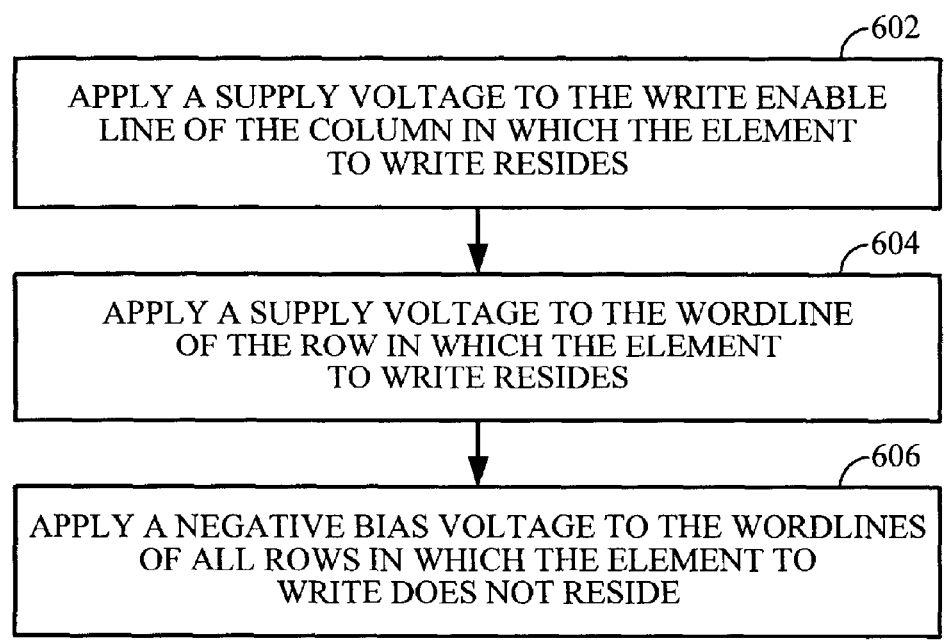
FIG. 6 is a flow chart of a particular illustrative embodiment of a method of writing data in a memory array of devices with separate data read and write paths.

Referring to FIG. 6, a flow chart of a particular illustrative embodiment of a method of writing data in a memory array of devices having separate data read and write paths is depicted.

A device that it is to be written to resides in a selected row and column. At 602, a supply voltage is applied to a write enable line of the selected column. For example, in FIG. 4, a selected device resides in the middle column, making the middle column the selected column, and VDD is applied to the write enable line 402 of the middle column. Applying the supply voltage activates the second gates 108 of each of the transistors 104 of the devices 100 in the selected column and lowers the threshold voltage for the first gates 106 of each of the transistors 104 of the devices 100 in the selected column. A write disable bias voltage, such as a zero voltage or a negative voltage, may be applied to write enable lines corresponding to non-selected columns.

At 604, the supply voltage is applied to the word line of a selected row. For example, in FIG. 4, the selected device resides in the top row, making the top row the selected row, and VDD is applied to the word line 404 of the top row. By applying the supply voltage to the word line of a particular row and to the write enable line of a particular column, any of the devices in the memory array may be selected for a write operation.

When a selected word line is set to the supply voltage, at least one unselected word line of the plurality of word lines in the memory array may be set to a negative value during write operations to prevent a write operation from occurring at cells coupled to the unselected word lines. For example, at 606, a negative bias voltage is applied to the word lines of all unselected rows, effectively turning the transistors 104 of the devices 100 in the unselected rows off. For example, in FIG. 4, the selected device does not reside in the middle or bottom rows, and a negative voltage –ve is applied to the word lines 406 and 408 of the unselected rows. Thus, only the selected memory cell has a high write current (Iwrite). Each of the half-selected memory cells has a low read current.

Thus, a particular illustrative embodiment employing the method of FIG. 6 can, during a write cycle, have a single selected memory cell, and the single selected memory cell can have a high write current (Iwrite).

Figure 7:
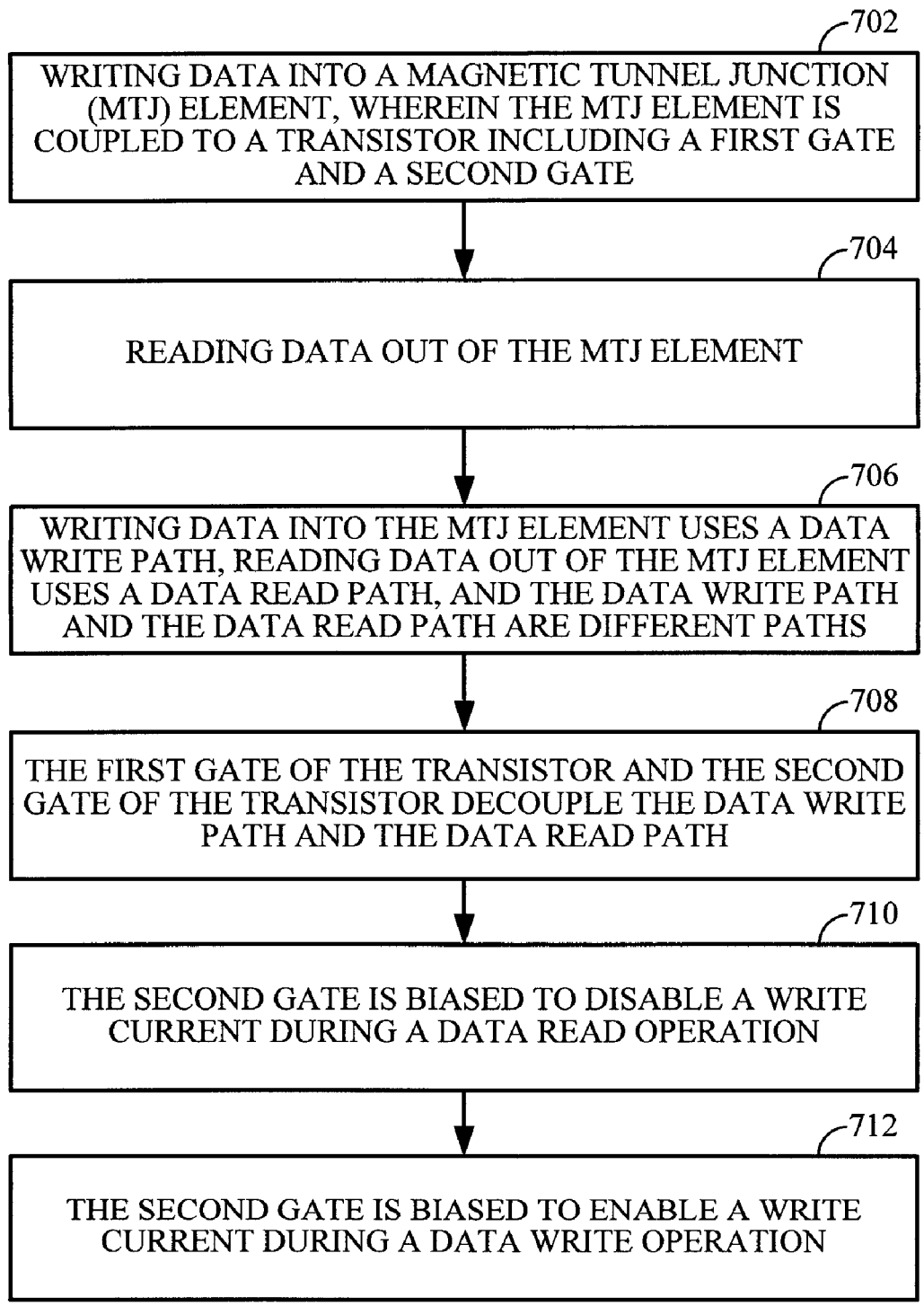
FIG. 7 is a flow chart of a particular illustrative embodiment of a method of storing data in a spin-torque transfer magnetoresistive random access memory (STT-MRAM).

Referring to FIG. 7, a flow chart of a particular illustrative embodiment of a method of storing data in a spin-torque transfer magnetoresistive random access memory (STT-MRAM) is depicted. At 702, data is written into a magnetic tunnel junction (MTJ) element, where the MTJ element is coupled to a transistor that includes a first gate and a second gate. For example, in the top row, center column of FIG. 4, data is written into a MTJ element, and the MTJ element is coupled to a transistor including a first gate and a second gate. At 704, data is read out of the MTJ element. For example, data is read out of the MTJ element in the top row, center column of FIG. 3.

At 706, data is written into the MTJ element using a data write path, data is read out of the MTJ element using a data read path, and the data write path and the data read path are different paths. For example, with regard to the MTJ element in the top row, center column of FIGS. 3 and 4, data is written into the MTJ element using a data write path, data is read out of the MTJ element using a data read path, and the data write path and the data read paths are different paths.

At 708, the first gate of the transistor and the second gate of the transistor decouple the data write path and the data read path. For example, the first gate and the second gate of the transistor depicted as part of the MTJ element in the top row, center column of FIGS. 3 and 4 decouple the data write path and the data read path.

At 710, the second gate is biased to disable a write current during a data read operation. For example, the second gate of the transistor depicted as part of the MTJ element in the top row, center column of FIGS. 3 and 4 disables a write current during a data read operation.

At 712, the second gate is biased to enable a write current during a data write operation. For example, the second gate of the transistor depicted as part of the MTJ element in the top row, center column of FIGS. 3 and 4 is biased to enable a write current during a data write operation.

Thus, a system employing the method of FIG. 7 uses an access transistor including a first gate and a second gate coupled to a MTJ element to both write data into (702) the MTJ element and read data out of (704) the MTJ element.

The disclosed system and method is unique and has a number of benefits besides those previously mentioned. The system can allow further reduction of sense amplifier area in cases in which the write enable signal is an analog signal and an IG-FinFET is used. In such cases, the IG-FinFET can act as a clamp (that is, it can limit the current to a value desired) in current sensing. The system can reduce leakage in STT-MRAM devices. One way to reduce leakage is by applying a negative bias voltage to unselected rows of a symmetric transistor 104 during operation. Another way to reduce leakage is by using an asymmetric transistor 104 that is designed so that its first gates 106 are off even if a negative bias potential is not applied to its first gate 106. In an asymmetric transistor, a first threshold voltage of the first gate is different from a second threshold voltage of the second gate.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments described herein but is to be accorded the widest scope possible consistent with the principles and novel features as defined by the following claims.

What is claimed is:

1. A device comprising:
   a spin transfer torque (STT) magnetic tunnel junction (MTJ) element; and
   a transistor coupled to the STT-MTJ element,
   wherein the transistor includes a first gate and a second gate, wherein the STT-MTJ element is within a memory cell in a memory array, wherein the first gate is coupled to a word line of the memory array, and wherein the second gate is coupled to a write enable line of the memory array.

2. The device of claim 1, wherein the STT-MTJ element comprises:
   a free magnetic layer;
   a tunnel barrier; and
   a pinned magnetic layer;
   wherein a data value stored at the STT-MTJ element is determined by a direction of a write current though the tunnel barrier.

3. The device of claim 2, wherein the first gate and the second gate are independently biasable.

4. The device of claim 1, wherein a read path includes an inversion channel corresponding to the first gate.

5. The device of claim 4, wherein the first gate limits a maximum current to not exceed a critical disturbance current value of the STT-MTJ element.

6. The device of claim 5, wherein a first threshold voltage of the first gate is different from a second threshold voltage of the second gate.

7. The device of claim 6, wherein the transistor is an independent gate "fin" Field Effect Transistor (IG-FinFET).

8. The device of claim 1, wherein the transistor defines a read path and a write path for the STT-MTJ element, and wherein the read path and the write path are decoupled by the first gate and the second gate.

9. The device of claim 8, wherein the second gate is coupled to gates of multiple memory cells in a column of the memory array.

10. A device comprising:
    as in transfer torque (STT) magnetic tunnel junction (MTJ) element; and
    a transistor coupled to the STT-MTJ element,
    wherein the transistor includes a first gate and a second gate, wherein a first signal applied to the second gate enables a data write at the STT-MTJ element, and wherein a second signal applied to the second gate disables a data write at the STT-MTJ element.

11. The device of claim 10, wherein the first gate has an inversion channel, and wherein a read path includes the inversion channel.

12. The device of claim 11, wherein the first gate limits a maximum current to not exceed a critical disturbance current value of the STT-MTJ element.

13. The device of claim 12, wherein a first threshold voltage of the first gate is different from a second threshold voltage of the second gate.

14. The device of claim 13, wherein the transistor is an independent gate "fin" Field-Effect Transistor (IG-FinFET).

15. A memory comprising:
    an array of memory cells, the array including a plurality of columns, each memory cell in the array of memory cells including a magnetic tunnel junction (MTJ) device coupled to a dual-gate transistor, the dual-gate transistor having a first gate coupled to a word line of a plurality of word lines and having a second gate coupled to a write enable line of a plurality of write enable lines;
    wherein at least one column of the plurality of columns is controllable by the write enable line during a write operation.

16. The memory of claim 15, wherein the memory array includes a plurality of rows, and wherein at least one row of the plurality of rows is controllable by the word line during a read operation.

17. The memory of claim 15, wherein the memory array includes a plurality of rows, and wherein a particular row of the memory array is addressable via a particular word line.

18. The memory of claim 15, wherein a read operation is performed by biasing the write enable line and the word line to enable a read current and not a write current through the MTJ device.

19. The memory of claim 15, wherein at least one unselected word line of the plurality of word lines in the memory array is set to a negative value during a write operation.

20. The memory of claim 15, wherein the first gate is biased at a logical high level and the second gate is biased at a logical low level to read data.

21. A device comprising:
    a magnetic tunnel junction (MTJ) element; and
    a common portion of a read/write data path that includes a transistor coupled to the MTJ element,
    wherein the transistor includes a first gate and a second gate, wherein the first gate is coupled to a word line, and wherein the second gate is coupled to a write enable line.

22. The device of claim 21, wherein the first gate is active during a read operation, and wherein both the first gate and the second gates are active during a write operation.

23. A method for storing data in a spin-torque transfer magnetoresistive random access memory (STT-MRAM), the method comprising:
    writing data into a magnetic tunnel junction (MTJ) element; and
    reading data out of the MTJ element;
    wherein the MTJ element is coupled to a transistor, wherein the transistor includes a first gate and a second gate, wherein writing data into the MTJ element uses a data write path, wherein reading data out of the MTJ element uses a data read path, wherein the data write path and the data read path are different paths, and wherein the first gate of the transistor and the second gate of the transistor decouple the data write path and the data read path.

24. The method of claim 23, wherein the second gate is biased to disable a write current during a data read operation.

25. The method of claim 24, wherein the second gate is biased to enable a write current during a data write operation.

* * * * *

UNITED STATES PATENT AND TRADEMARK OFFICE
CERTIFICATE OF CORRECTION

PATENT NO. : 8,130,534 B2
APPLICATION NO. : 12/350304
DATED : March 6, 2012
INVENTOR(S) : Mohamed Hassan Abu-Rahma et al.

It is certified that error appears in the above-identified patent and that said Letters Patent is hereby corrected as shown below:

Title Page
Item (54) and Column 1, Line 1, should be:

SYSTEM AND METHOD TO READ AND WRITE DATA AT A MAGNETIC TUNNEL JUNCTION ELEMENT

Signed and Sealed this
Thirtieth Day of October, 2012

David J. Kappos
*Director of the United States Patent and Trademark Office*